United States Patent [19]
Haramaki et al.

[11] Patent Number: 5,231,366
[45] Date of Patent: Jul. 27, 1993

[54] SUPERCONDUCTING MAGNETIC FIELD GENERATING APPARATUS AND METHOD OF PRODUCING THE SAME

[75] Inventors: Takashi Haramaki, Tokai; Mituo Nakamura, Takahagi; Takao Funamoto, Hitachi; Masahiko Sakamoto, Hitachi; Teruhiro Takizawa, Hitachi; Takeshi Yamagiwa, Hitachi, all of Japan

[73] Assignee: Hitachi, Ltd., Tokyo, Japan

[21] Appl. No.: 663,471

[22] Filed: Mar. 4, 1991

[30] Foreign Application Priority Data

Mar. 2, 1990 [JP] Japan .................. 2-49294

[51] Int. Cl.$^5$ ............................. H01F 1/00
[52] U.S. Cl. .................. 335/216; 174/125.1; 29/599; 505/924
[58] Field of Search .............. 361/19; 174/125.1; 29/599; 335/216, 299, 300; 505/884, 879, 924, 926, 925, 927

[56] References Cited

U.S. PATENT DOCUMENTS

| | | | |
|---|---|---|---|
| 3,474,187 | 10/1969 | Donadieu | 174/125.1 X |
| 3,743,986 | 7/1973 | McInturff et al. | 335/216 |
| 3,767,842 | 10/1973 | Bronca et al. | 335/216 X |
| 4,242,536 | 12/1980 | Young | 29/599 X |
| 4,586,017 | 4/1986 | Laskaris et al. | 361/19 X |
| 4,623,862 | 11/1986 | Woolf | 335/216 |
| 4,635,015 | 1/1987 | Franksen | 335/216 |
| 4,647,888 | 3/1987 | Woolf et al. | 335/216 |
| 4,794,688 | 1/1989 | Wada | 29/599 |
| 4,904,970 | 2/1990 | Srivastava | 335/216 |

FOREIGN PATENT DOCUMENTS

59-16207 1/1984 Japan .
62-234880 10/1987 Japan .

*Primary Examiner*—Leo P. Picard
*Assistant Examiner*—Trinidad Korka
*Attorney, Agent, or Firm*—Antonelli, Terry, Stout & Kraus

[57] ABSTRACT

A superconducting magnetic field generating apparatus, and coil, a superconducting wire, a method of producing a coil and a method of connecting a superconducting wire which are suitable for such a superconducting magnetic field generating apparatus are disclosed. The superconducting magnetic field generating apparatus has a coil of a wound superconducting wire which is composed of superconducting wires with the end portions thereof connected with each other. Each of the superconducting wires is composed of a plurality of superconducting material wires embedded in a stabilizing member. The group of superconducting material wires is embedded at the connecting portion in a state in which the superconducting material wires are densely gathered to the central portion of the stabilizing member and the superconducting material wires are directly in contact with each other. The stabilizing member exists in the central portion of the assembly of the superconducting material wires and the stabilizing members are closely bonded to the superconducting material wires.

17 Claims, 6 Drawing Sheets

SUPERCONDUCTING MAGNETIC FIELD GENERATING APPARATUS AND METHOD OF PRODUCING THE SAME

FIELD OF THE INVENTION

The present invention relates to a superconducting magnetic field generating apparatus having a small current attenuation factor and, more particularly, to an improved superconducting magnetic field generating apparatus provided with a coil having a connecting portion of a superconducting wire, and a coil, a superconducting wire, a method of producing a coil and a method of connecting a superconducting wire which are suitable for such a superconducting magnetic field generating apparatus.

A superconducting magnetic field generating apparatus according to the present invention can be utilized in various fields such as a nuclear magnetic resonance image diagnostic apparatus and a nuclear fusion apparatus.

BACKGROUND OF THE INVENTION

For a superconducting wire for connection is used a superconducting fine multi-wire composed of a lamination of multiplicity of superconducting material wires which are embedded in a stabilizing material such as copper (Cu) and aluminum (Al) and stretched to a desired outer diameter. When such a superconducting wire is connected, various methods such as soldering, blazing, press bonding and welding have been conventionally adopted, but the connecting portion obtained by any of these methods has a large electric resistance and generates a large amount of heat during electric conduction, which produces problems in practical use.

In order to ameliorate these defects, a method of connecting a superconducting fine multi-wire by accommodating the fine multi-wire in a connecting tube with the exposed superconducting material wires laminated on each other and press bonding through the connecting tube for the purpose of establishing electric conduction is disclosed in Japanese Patent Laid-Open No. 16207/1984. In this method, the stabilizing member is removed from the connecting portion of the superconducting material wires and the exposed superconducting material wires were accommodated in the connecting pipe in the state of being laminated on each other. The superconducting filaments were press bonded through the pipe so as to bond the superconducting filaments accommodated with each other.

In this connecting method, however, the superconducting filaments are brought into contact with each other only on the portions at which the outer surfaces thereof are, thereby making it difficult to secure a high critical current value. In addition, since the filaments are press bonded only in one direction, the contact between the superconducting filaments is insufficient.

Japanese Patent Laid-open No. 234880/1987 proposes a method of bonding a superconducting wire which is capable of enhancing the packing ratio of the superconducting filaments. This method is characterized in that each of the exposed core filament is sandwiched between a double core having exposed connecting superconducting filaments, the sandwiched portions of all the filaments are integrally covered with a metal ring and the filaments are bonded by press bonding the metal ring. For example, the end portion of each connecting superconducting filament is extended so as to cover the end of the stabilizing member and the end portion of the metal ring is situated at the end portion of each filament. In this state, the metal ring is press bonded so as to bond the filaments. As in this example, in the case in which the number of superconducting material wires (filaments) is very small, it is effective to the enhancement of the packing ratio to use connecting superconducting filaments. However, since the filaments are press bonded only in one direction, the contact between the superconducting filaments cannot be said to be sufficient. In addition, the sectional area or the length of the stabilizing member after press bonding is not taken into consideration, and there is variation in the connection resistance value. Thus, the superconducting wire obtained by this method cannot be used as a permanent current superconductor.

In the above-described prior art, since neither a method of press bonding the superconducting material wires (filaments) by the stabilizing member nor the sectional areal ratio or the length of the connecting portion is taken into consideration, the real connection of the superconducting material wires cannot be achieved, which would produce a problem in the permanent electrical characteristics. In other words, the prior art has mainly aimed at combining the superconducting material wires and cannot realize the connection which can exert the proximity effect of the superconducting wire materials or prevent the shunt loss.

SUMMARY OF THE INVENTION

Accordingly, it is an object of the present invention to provide a superconducting magnetic field generating apparatus which can generate a magnetic field having a very small current attenuation factor and a long-term stability, and to provide a superconducting coil which is suitable for such a superconducting magnetic field generating apparatus and a method of producing the same.

To achieve this aim, the present invention provides a superconducting magnetic field generating apparatus having a coil of a wound superconducting wire which is composed of superconducting wires with the end portion thereof connected with each other, each of the superconducting wires being composed of a plurality of superconducting material wires embedded in a stabilizing member; a superconducting switch connected to both ends of the coil; and means for cooling the coil and the superconducting switch; characterized in that the group of the superconducting material wires is embedded at the connecting portion in the state in which the superconducting material wires are densely gathered to the central portion of the stabilizing member and the superconducting material wires are directly in contact with each other; in that a stabilizing member exists in the central portion of the assembly of the superconducting material wires; and in that the stabilizing members are closely bonded to the superconducting material wires.

The present invention also provides a superconducting magnetic field generating apparatus such as that described above, characterized in that the group of the superconducting material wires and a group of other superconducting wire materials are embedded at the connecting portion in the state in which the superconducting material wires and the superconducting wire materials are densely gathered to the central portion of the stabilizing member and the superconducting material wires are directly in contact with each other; in that a stabilizing member exists in the central portion of the assembly of the superconducting material wires; and in that the stabilizing members are closely bonded to the superconducting material wires.

The present invention also provides a superconducting magnetic field generating apparatus such as that described above, characterized in that the connecting portion has a connection resistance of not more than $10^{-13}\Omega$ and a critical current value of not less than 80% of the critical current value of the superconducting wire. The present invention also provides a superconducting coil composed of coil units each of which is a wound superconducting wire having a plurality of superconducting material wires embedded in a stabilizing member and which are connected to each other by connecting the superconducting material wires to each other at the end portions of the respective coil units so as to have a predetermined coil turn, characterized in that the group of the superconducting material wires are embedded at the connecting portion in the state in which the superconducting material wires are densely gathered to the central portion of the stabilizing member and the superconducting material wires are directly in contact with each other; in that a low-resistance metal member exists in the central portion of the assembly of the superconducting material wires; and in that the stabilizing member, the metal member and the superconducting material wires are closely bonded to each other.

The coil may be a superconducting coil characterized in that the group of the superconducting material wires and a group of connecting superconducting wires are embedded at the connecting portion in the state in which the superconducting material wires and the connecting superconducting wires densely gathered to the central portion of the stabilizing member and the superconducting material wires are directly in contact with each other; in that a low-resistance metal member exists in the central portion of the assembly of the superconducting material wires; and in that the stabilizing member and the metal member are closely bonded to the superconducting material wires. The superconducting coil has a connection resistance of not more than $10^{-13}$ $\Omega$ and a critical current value of not less than 80% of the critical current value of the superconducting wire at the connecting portion.

The present invention also provides a superconducting wire characterized in that the group of the superconducting material wires is embedded at the connecting portion in the state in which the superconducting material wires are densely gathered to the central portion of the stabilizing member and the superconducting material wires are directly in contact with each other; in that a low-resistance metal member exists in the central portion of the assembly of the superconducting material wires; in that the stabilizing member, the metal member and the superconducting material wires are closely bonded to each other; and in that the connecting portion has a connection resistance of not more than $10^{-13}$ $\Omega$ and a critical current value of not less than 80% of the critical current value of the superconducting wire.

The present invention also provides a method of producing a superconducting coil comprising the steps of: forming predetermined turns by winding a superconducting wire; exposing the group of superconducting material wires at the end portion of the superconducting wire; disposing a core member of a stabilizing material at the central portion of the group of superconducting material wires; inserting the group of superconducting material wires and the core member into the hollow portion of a hollow stabilizing member; and pressing the outer periphery of the hollow stabilizing member so as to gather the exposed superconducting material wires to the direction of the core member, thereby closely bonding the hollow stabilizing member and the core member with the superconducting material wires.

This is a method of producing a coil of a superconducting wire comprising the steps of forming a coil by winding a superconducting wire having a plurality of superconducting metal material wires embedded in a stabilizing member; assembling exposed portion of the superconducting metal material wires and the exposed superconducting metal filament of another superconducting wire being connected to the superconducting wire and an auxiliary connecting member to the connecting end portions of the superconducting wires with a core member of a stabilizing material inserted into the central portion thereof; inserting the group of superconducting material wires and the end portions of the superconducting wires into the hollow portion of a hollow stabilizing member; and press working the assembled portion by applying a pressure to the hollow stabilizing member from the outside so as to gather the superconducting material wires to the central portion of the hollow stabilizing member, thereby closely bonding the hollow stabilizing member and the core member with the superconducting material wires and bringing the superconducting material wires into direct contact with each other.

The present invention also provides a method of connecting superconducting wires comprising the steps of: gathering superconducting metal material wires exposed at the connecting end portion of a superconducting wire which has a plurality of the superconducting metal material wires embedded in a stabilizing member and the superconducting metal material wires exposed at the connecting end portion of another superconducting wire around a core member of a stabilizing material; inserting the group of superconducting material wires and the end portions of the superconducting wires into the hollow portion of a hollow stabilizing member; and press working the assembled portion so as to gather the superconducting material wires to the central portion of the hollow stabilizing member, thereby closely bonding the hollow stabilizing member and the core member with the superconducting material wires and bringing the superconducting material wires into direct contact with each other.

A superconducting wire according to the present invention is composed of unit superconducting wires each of which is composed of a plurality of superconducting metal material wires embedded in a stabilizing member. At the end portion of each unit superconducting wire, the superconducting metal material wires are exposed and the exposed superconducting metal material wires are connected to each other. The superconducting material wires at the connection portions are gathered at the central portion of a hollow cylindrical connection stabilizing member and this connection stabilizing member is bonded with the superconducting wire and the superconducting material wires by, or example, metal bonding.

In order to greatly reduce the connection resistance between the superconducting material wires, the present inventors investigated the way of gathering the superconducting material wires. For this purpose, a connecting sleeve was produced from the stabilizing material used for the superconducting wire unit and the superconducting material wires were inserted into the sleeve. Thereafter, the sleeve of the stabilizing material was press bonded. By this method, however, the packing ratio of the assembled superconducting material wires was not enhanced as expected.

The packing ratio here means the ratio of the area (B) of the assembled superconducting material wires or the assembled superconducting material wires and the superconducting material wires used as an auxiliary connecting member used for connection to the sectional area (A) of the connecting portion (on the surface of the connecting portion perpendicular to the longitudinal direction of the superconducting material wires) with the area of the stabilizing member removed therefrom. If the packing ratio is not less than 80%, the contact resistance between the superconducting material wires is greatly reduced and, hence, the connection resistance is also reduced. Especially, when the packing ratio is not less than 90%, the connection resistance is greatly reduced.

The reason why the packing ratio is not enhanced merely by gathering the superconducting material wires to the central portion of the sleeve of the stabilizing member which is subjected to some working is considered to be that since the stabilizing member is generally a soft metal such as copper and aluminum, the pressure of the plastic working applied is insufficient for gathering the group of superconducting material wires. As a countermeasure, the present inventor disposed a core member consisting of a low-resistance metal material, in particular, stabilizing material at the center of the group of superconducting material wires so as to apply a sufficient plastic working force to the group of superconducting material wires. As a result, it was found that the packing ratio of the group of superconducting material wires was greatly enhanced, that the contact between the superconducting material wires was also greatly improved and that the group of superconducting material wires and the stabilizing member were closely bonded. When the characteristics of the coil produced from a superconducting wire having the connection portion obtained in this way were measured, the connection resistance of the connecting portion was about not more than $10^{-13}$ Ω, mostly, not more than $10^{-14}$ Ω, and the critical current value of the superconducting having the connecting portion was about not less than 80%. In addition, in the connecting portion obtained in this way, the fluctuation in connection resistance is very small. In the prior art, it is impossible to obtain a constant connection resistance, but the present invention can completely solve this problem.

As a result of various studies of a plastic working method, it has been found that and a method of gathering the superconducting material wires by an isostatic pressing method or by forming them using a die having a plurality of press surfaces are suitable. By these methods, since the more the sleeve of a stabilizing member is pressed, the closer the superconducting material wires are gathered to the center of the sleeve, the packing ratio is enhanced. In addition, it is possible to control the packing ratio of the superconducting material wires by controlling the pressing force. If vibration by ultrasonic waves is added when the superconducting material wires are formed by using a die, the packing ratio is further enhanced.

It is impossible to reduce the connection resistance and produce a stable connecting portion merely by connecting the superconducting material wires with each other. Since the superconducting material wires are protected by the stabilizing member there around and constitute a permanent current circuit, it is also necessary to clarify the relationship between the superconducting material wires and the stabilizing member at the connecting portion. Firstly, it is necessary to obtain the ratio of the gathering portion of the superconducting material wires and the stabilizing portion there around. As a result of various studies, it has been found that if it is assumed that the sectional area of the superconducting material wires or the superconducting material wires and other superconducting material wires used as an auxiliary connecting member is 1, the sectional area of the stabilizing member is preferably not less than 10, more preferably not less than 30.

The length of the connecting portion was investigated. As a result, it has been found that in the case of adopting an isostatic pressing method, the superconducting material wires are preferably wrapped with a stabilizing member having a length of not less than 10 mm, more preferably not less than 15 mm in order to obtain good connection of the superconducting wire. In a typical embodiment of the present invention, a stabilizing member is plastically worked by an isostatic pressing method or by an apparatus having a plurality of pressing surfaces so as to press bond the group of superconducting material wires so that the sectional area of the stabilizing member around the group of superconducting material wires is not less than 10 with respect to the sectional area 1 of the group of superconducting material wires including the auxiliary connecting member and the length of the connection portion is not less than 15 mm. The plastic working is carried out at normal temperature in an atmospheric environment, and this method enables cold metal bonding. After plastic working, the stabilizing member is preferably further pressurized or pressed so as to make the contact between the superconducting material wires strong.

The unit superconducting wire may have a coiled portion or it may be a simple linear wire. If simple linear units superconducting wires are connected, a long wire is obtained.

The superconducting material wires are gathered to the center of the stabilizing member by plastic working so that the packing ratio is not less than 80% and the areal ratio of assembly of the superconducting material wires to the stabilizing member there around is 1: not less than 10. As to the area of the core member occupies, the connecting portion is so formed that the areal ratio of the assembly of the superconducting material wires or the superconducting material wires and other superconducting material wires used as an auxiliary connecting member (hereinunder referred to merely "superconducting material wires" including the latter case), the core member and the stabilizing member is 1: 0.3 to 5: not less than 10. If the sectional area of the of the superconducting material wires (in this case, not including other superconducting material wires used as an auxiliary connecting member) is not more than 1 mm² in total, especially, not more than 0.5 mm², an auxiliary members may be added order to enhance the packing ratio of the superconducting material wires.

If a material for the auxiliary connecting member, a material the same as the superconducting material wires, in other words, a material selected from a stabilizing material such as Nb-Ti, Nb$_3$Sn, Cu, Al and Ag or a coupling material such as Pb, Sn, Bi and In is used, the packing ratio is enhanced. The auxiliary connecting member may be formed into a linear member or a powder, or may be plated, sprayed, ion implanted or deposited.

A connection stabilizing member is selected from a group consisting of Cu, Al, Au and Ag. As the core member, a single metal selected from Cu, Al, Au and Ag, a composite metal thereof, a single metal selected from Pb, Sn, Bi and In or an alloy thereof is used.

The superconducting material wires are connected by a plastic working method by an apparatus selected from a CIP (cold isostatic press machine) a rolling mill, a compressing machine, etc. The apparatus used is provided with a control mechanism for controlling the configuration of the connecting portion to a predetermined configuration having a packing ratio of not less than 80%.

Examples of application of a magnetic field generating apparatus according to the present invention are nuclear fusion apparatus, nuclear magnetic resonance image diagnostic apparatus (MRI) and nuclear magnetic resonance analyzer (NMR).

Each of the NMR and MRI is provided with a shield, a liquid helium tank surrounding the shield, and a superconducting magnet disposed in the liquid helium tank. The coil of the superconducting magnetic is composed of a superconducting wire having the above-described connecting portion.

In the connecting portion of a superconducting wire according to the present, the metal superconducting material wires are gathered at the central portion of the connection stabilizing member at an enhanced packing ratio by plastic working and the connection between the superconducting material wires is close. Therefore, the proximity effect of the superconducting material wires is adequately attained. By inserting the core member consisting of a metal having a low electric resistance into the central portion of a group of superconducting material wires, arranging the group of superconducting material wires or the group of superconducting material wires and superconducting material wires as an auxiliary connecting member around the core member, inserting the assembly into a hollow cylindrical stabilizing member and caulking, not only is the packing ratio is enhanced but also the ratio of the group of superconducting material wires and the stabilizing member there around is adjusted. The proximity effect is adequately attained and the connecting state in which the connection resistance loss is very small is easily achieved.

In order to exert an adequate proximity effect, it is necessary to make the contact between the superconducting material wires as close as possible. For this purpose, the relationship between the pressure and the packing ratio was investigated by inserting the superconducting material wires into the hollow portion of the stabilizing member and pressing the stabilizing member from the left-hand side and the right-hand side by using two divided dies or the like. When the connection resistance of the thus-obtained coupling was measured by a four-terminal method, it was found that if the packing ratio of the superconducting material wires is not less than 80%, a high critical current value is obtained. In order to obtain a more stable critical current value, the packing ratio of not less than 90% is desirable.

However, a high packing ratio solely is insufficient for producing a joint having a small connection resistant loss. The ratio of the stabilizing member as well as the packing ratio is important. It is because the superconducting wire before connection attaches much importance to the ratio of the superconducting material wires and the stabilizing member there around. As a result of investigating the areal ratio of the connected superconducting material wires and the stabilizing member, it was found that when the areal ratio of the superconducting material wires and the stabilizing member there around is 1: not less than 10, the critical current value is not lowered. A preferable areal ratio of the stabilizing member was 30 to 50 based on the area of the group of superconducting material wires. The areal ratio of the core member is preferably 0.3 to 5, more preferably 0.5 to 1 based on the area of the group of superconducting material wires.

The length of the coupling also has a range which can maintain a stable critical current value. When the relationship between the length of the coupling and the critical current value was investigated, if the packing ratio of the superconducting material wires is not less than 80%, the preferable length of the coupling was not less than 10 mm. The length in the range of 20 to 25 mm is more preferable.

In a superconducting having a small critical current value, the number of the superconducting material wires is small. If the number of the superconducting material wires is small, the packing ratio of the superconducting material wires is not enhanced. In order to secure a packing ratio of not less than 80%, the sectional area of all the superconducting material wires is preferably not less than 0.3 mm$^2$, more preferably not less than 0.5 mm$^2$ if the sectional area is less than 0.3 mm$^2$, an auxiliary member such as exposed superconducting material wires are preferably added.

The material of the auxiliary connecting member or the core of member is preferably a metal having as high a purity as possible, as described above. A metal which can exhibit a superconducting characteristic at 4K is more preferable. Metals which cannot exhibit a superconducting characteristic such as Cu, Al, Au and Ag must at least have a high purity such as not less than 99.9%. Other metals such as Pb and Sn also must have a purity of not less than 99.9%.

For bonding the superconducting material wires, a cold isostatic pressing machine or a press machine having at least two press surfaces is preferably used. This is because it is possible simultaneously to assemble of the group of superconducting material wires and to bond the superconducting material wires and the stabilizing member by pressing the stabilizing member in the central direction of the group of the superconducting material wires. Alternatively, the stabilizing member is clamped between concave rolls so as to form it into a predetermined configuration. It is also possible to form the stabilizing member into a cylinder by a compressing machine and by using a concave metal.

By virtue of the features of the present invention, since the connection resistance at the connection portion of the superconducting wire in the superconducting magnetic field generating apparatus is very small and the critical current value is very large, it is possible to generate a magnetic field which is stable for a long time.

Moreover, the present invention is applicable to various electromagnets, NMR, MRI, magnet for nuclear fusion and the like.

The above and other objects, features and advantages of the present invention will become more apparent from the following description when taken in connection with the accompanying drawings which show, for the purposes of illustration only, several embodiments in accordance with the present invention.

BRIEF DESCRIPTION OF THE DRAWINGS

FIGS. 5(a)–5(f) represents a flow chart of the method of connecting superconducting wires according to the present invention;

DETAILED DESCRIPTION

Figure 1:
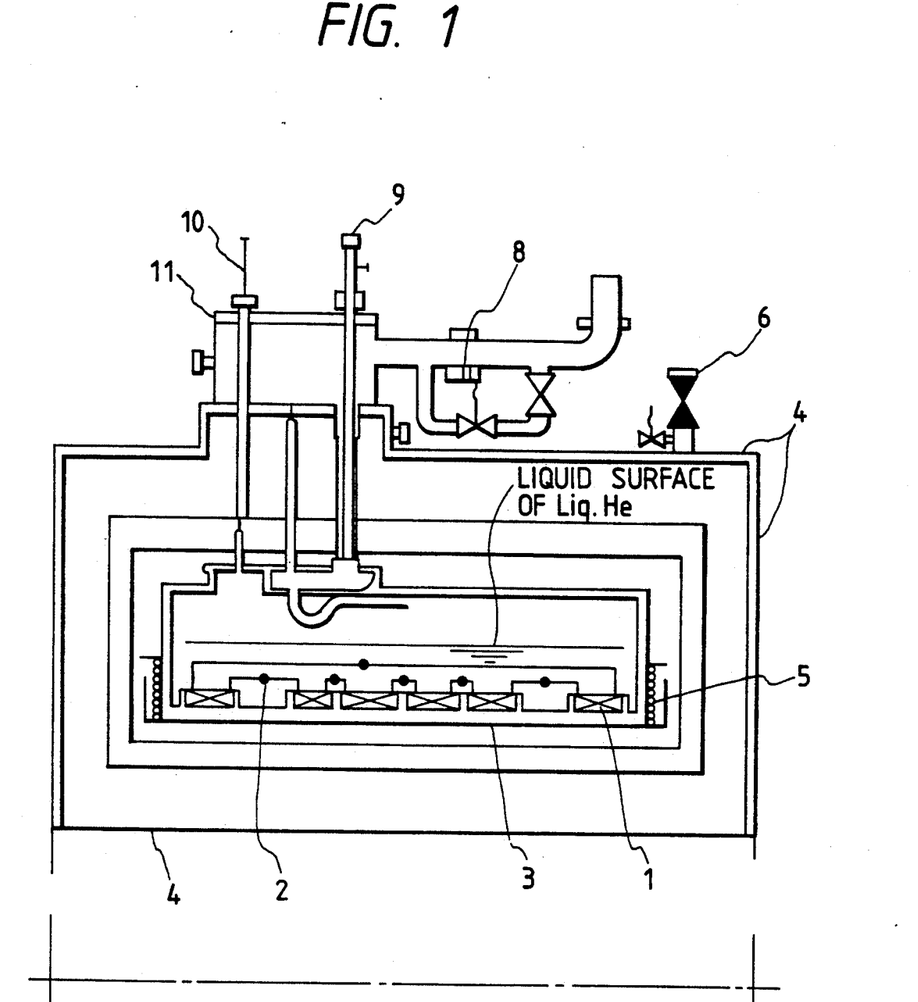
FIG. 1 is a partially sectional view of the structure of a superconducting magnetic field generating apparatus according to the present invention.

In FIG. 1, a plurality of superconducting coil units 1 are connected to the adjacent coil unit at a connecting portion 2 so as to form predetermined coil turns.

The coil is charged into a helium tank 3 and cooled to 4K. The helium tank 3 is surrounded by a heat-insulating vacuum container 4 provided with an air outlet 6. The helium tank 2 is provided with a supply pipe 10 for pouring liquid helium therethrough, a service port 11 used at the time of inspection for maintenance, a power lead 9 connected to a power source and a braking plate 8 for safety. FIG. 1 is half of the section of a cylindrical superconducting magnetic field generating apparatus taken along the center axis thereof.

Figure 2:
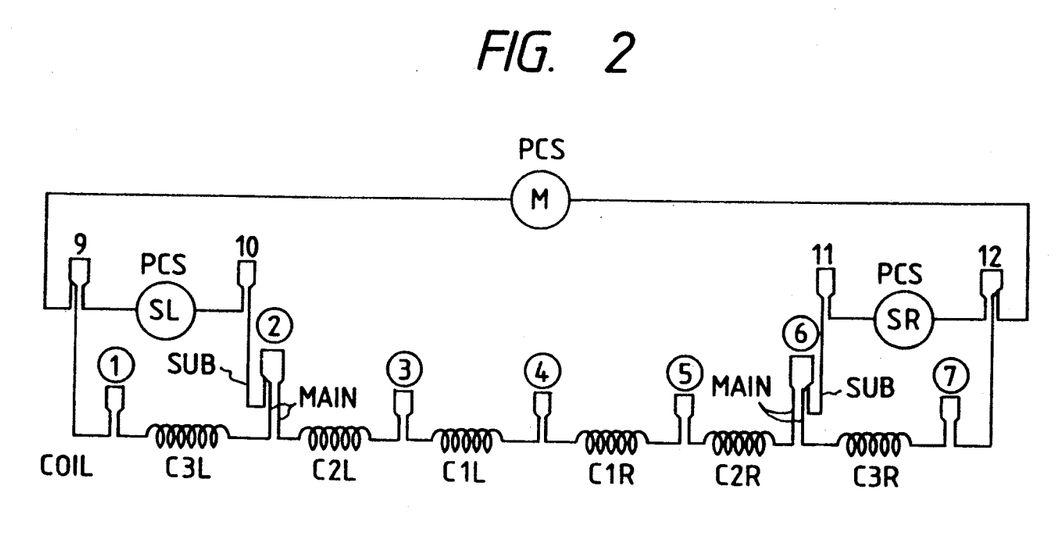
FIG. 2 is a circuit diagram showing the structure of a superconducting coil.

FIG. 2 shows an electric circuit of a superconducting coil. The superconducting coil is composed of coil units C1R, C2R, C3R, C1L, C2L and C3L, connecting portions (1) to (12) for connecting the adjacent coil ends and a superconducting switch PCS.

Figure 3:
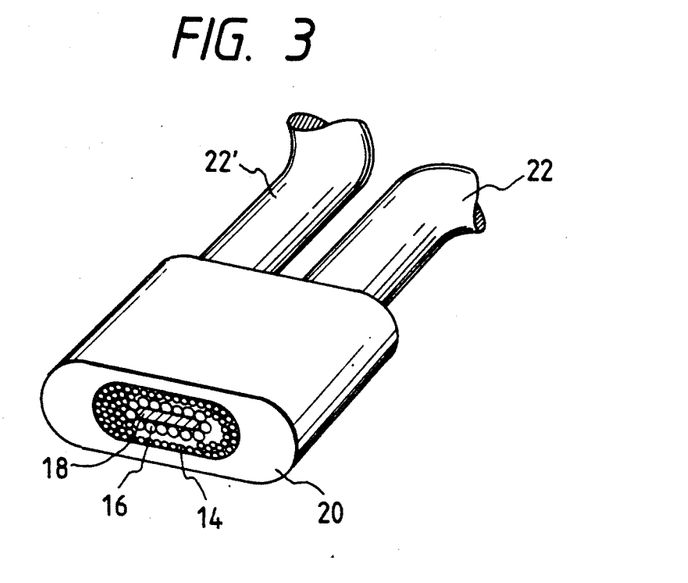
FIGS. 3 and 4 are perspective views of the structures of the connecting portions of superconducting wires according to the present invention.
Figure 4:
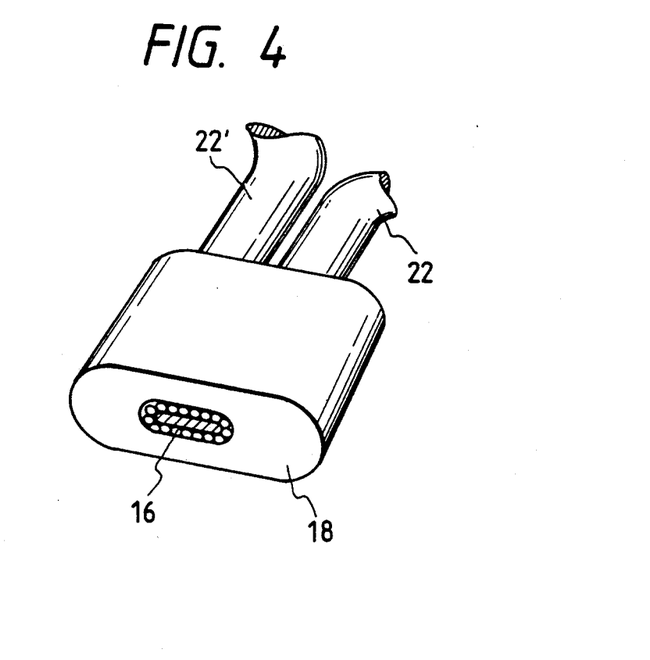

The structures of these connecting portions are shown in the sectional perspective views of FIGS. 3 and 4. In FIG. 3, the end portions of superconducting wires 22, 22' are immersed in 60% $HNO_3$ and a stabilizing member 20 is removed therefrom at those portions so as to expose superconducting material wires 16. In an example shown in FIG. 3, superconducting material wires 14 which are prepared as an auxiliary connecting member separately from the superconducting material wires 16 are combined with the exposed superconducting material wires 16. A core member 18 of a stabilizing material is inserted into the central portion of the group of the superconducting material wires 14 and 16.

In an example shown in FIG. 4, only the superconducting material wires are used without any auxiliary connecting member. In other words, in the case in which the sectional area of the group of superconducting material wires is not less than 0.3 $mm^2$, especially, not less than 0.5 $mm^2$, connection is possible solely by the superconducting material wires.

In FIG. 5(a), the connecting ends of superconducting wires 31 and 32 of an Nb-Ti metal are treated as described above so as to expose superconducting material wires (filament) 33. A plate of pure copper (e.g., having a thickness of 0.2 mm, a width of 1.5 mm and a length of 25 mm) is inserted into the central portion of the group of superconducting material wires 33, and the group of superconducting material wires 33 is covered with superconducting material wires 34 which are prepared as an auxiliary connecting member 34 separately from the superconducting material wires 33 and are connected by a connecting wire (superconducting wire) 35. In this way, the assembly shown in FIG. 5(c) is constituted. The assembly is covered with a copper sleeve, thereby constituting the assembly shown in FIG. 5(d). The outer periphery of the copper sleeve is then pressed by using a die or the like for plastic working, whereby the superconducting material wires 33 and 34 are gathered toward the copper core member and the copper sleeve, the superconducting material wires, the superconducting material wires as the auxiliary connecting member and the copper core member are brought into close contact with each other, as shown in FIG. 5(e). Especially, by bringing the superconducting material wires into direct and close contact with each other and by realizing the packing ratio of not less than 80%, the connection resistance can be greatly reduced.

In order to further improve the bonded state, the connecting portion obtained is plastically worked by pressing it from the upper side and the lower side, as shown in FIG. 5(f), whereby the packing ratio of the superconducting material wires is further enhanced and the contact between the stabilizing member and the superconducting material wires becomes closer. When the bonding operation is finished, the connecting wire is cut off, if necessary.

When the section at the central part of the connecting portion is observed, it is found that the superconducting material wires and the superconducting material wires as an auxiliary connecting member are in close contact with each other on the outer periphery of the core member, thereby increasing the packing ratio.

The plastic working may also be carried out by isostatic caulking or by using a die having a plurality of pressing surfaces. When the bonding treatment is carried out at normal temperature, the superconducting material wires are metal bonded with the cleanness of the superconducting material wires before bonding and exert the proximity effect on each other.

Figures 6A, 6B:
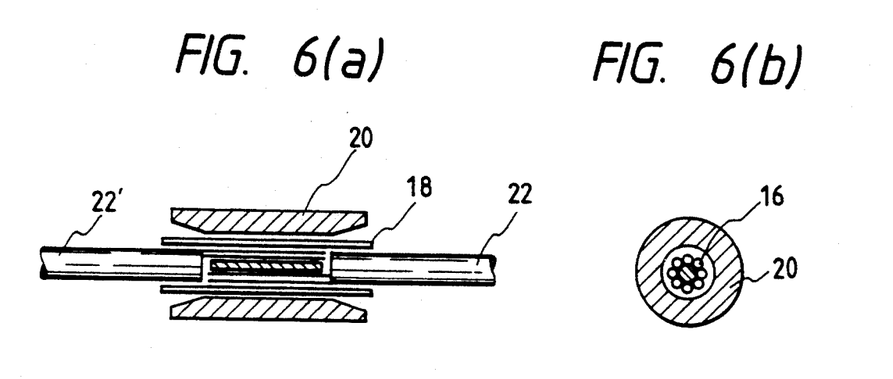
FIGS. 6(a), 6(b), 7(a) and 7(b) are sectional views of the main parts or different embodiments of the present invention.
Figure 7A:
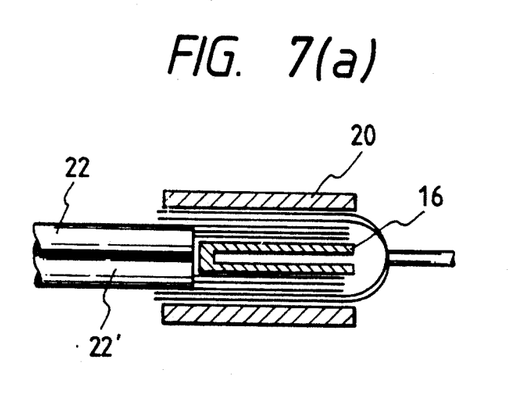
Figure 7B:
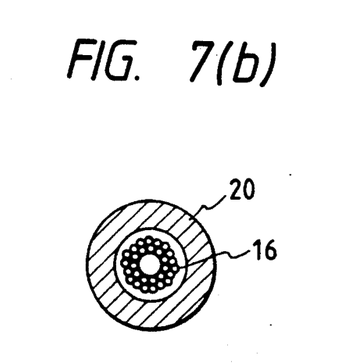

FIGS. 6 and 7 are sectional views of other embodiments of the present invention. FIG. 6(a) is a sectional view of superconducting wires in the case of connecting them coaxially, taken along the longitudinal direction thereof; and FIG. 6(b) is a sectional view of the superconducting wires shown in FIG. 6(a), taken along the surface perpendicular to the axis.

FIG. 7(a) is a sectional view of superconducting wires with a hollow copper pipe inserted as a core member, and FIG. 7(b) is a sectional view of the superconducting wires shown in FIG. 7(a), taken along the surface perpendicular to the axis. In this case, stainless steel rod is inserted into the copper pipe or a copper rod is used and after the above-described bonding process, the center of the copper rod is drilled. Since it is possible to cool the connecting portion adequately with liquid helium in this way, the connection portion has a large critical current value.

Figure 5:
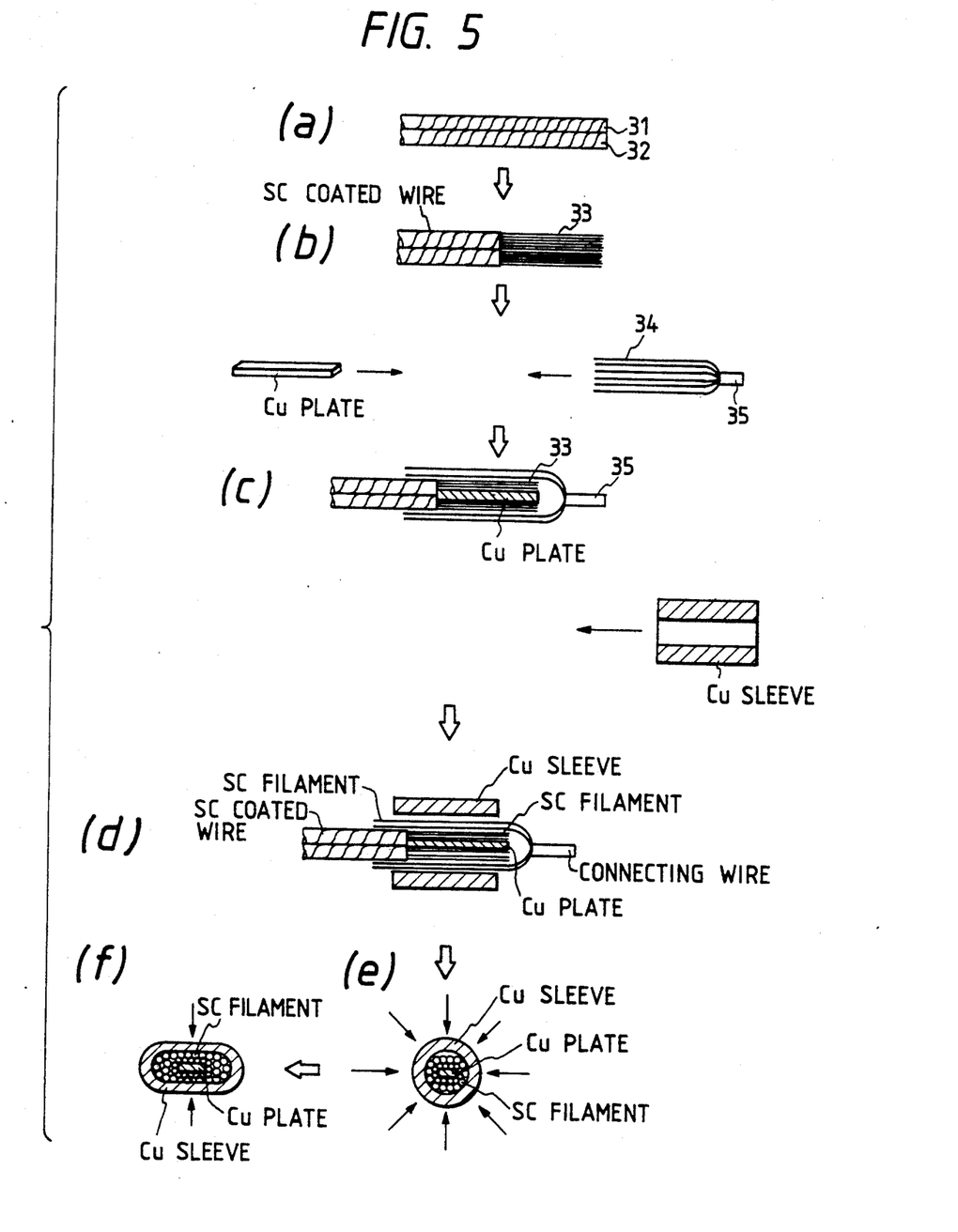

The following examples will be explained with reference to FIG. 5.

EXAMPLE 1

Superconducting wires having a diameter of 1.0 mm were selected for the Nb-Ti superconducting wires 31, 32. Each of the superconducting wires 31, 32 was composed of 24 metal superconducting material wires 33 having a diameter of 75 pm and embedded in stabilizing copper. Each of the superconducting wires 31, 32 was immersed in nitric acid to a depth of about 30 mm so as to remove the stabilizing copper from the end portions of the metal superconducting material wires being bonded. After the end portions of the metal superconducting material wires were exposed in this way, they were washed with water.

Since the sum of the sectional areas of the superconducting material wires being bonded was as small as 0.2 mm$^2$, the group of superconducting material wires 33 was covered with an Nb-Ti auxiliary connecting material 34, which had the same material as the superconducting material wires 33 and was prepared separately from the superconducting material wires 33. The auxiliary connecting member 34 was also immersed in nitric acid to a depth of about 30 mm so as to remove the stabilizing copper and expose 1060 superconducting material wires as the auxiliary connecting member 34 each having a diameter of 35 μm were used. The sectional area of the sum of the auxiliary connecting member 34 was about 1.0 mm$^2$. As shown in FIG. 5(c), pure copper (oxygen free copper) having a thickness of 0.2 mm$^2$, a width of 1.5 mm and a length of 25 mm was inserted into the central part of the group of superconducting material wires. The group of superconducting material wires 33 was covered with the superconducting material wires as the auxiliary connecting member 34. The thus-obtained assembly was inserted into the hollow portion of the stabilizing copper sleeve having a diameter of 9.9 mm, an inner diameter of 2.2 mm and a length of 25 mm, as shown in FIG. 5(d). The copper sleeve was mounted on the die and formed by pressurizing it by a compressing machine. The copper sleeve was further plastically worked from the upper and lower portions to produce a connecting portion 7.2 to 6.8 mm in finish size. The packing ratio of the connecting portion obtained was about 90%.

The sectional areal ratio of the superconducting material wires, the core member and the stabilizing member after bonding was approximately 1:0.8:36. The section at the central portion after bonding is shown in FIG. 5(f).

EXAMPLE 2

The material for the Nb-Ti superconducting wires 31, 32 and the number of the superconducting material wires were the same as those in Example 1. The metal superconducting material wires were exposed in the same way as in Example 1. An oxygen free copper rod having a diameter of 1.0 mm and a length of 30 mm was inserted into the center of the group of superconducting material wires in the same way as in Example 1. The number of the superconducting material wires as the auxiliary connecting member 34 each having a diameter of 35 μm was reduced to half (530) the number of superconducting material wires as the auxiliary connecting member 34 in Example 1 so as to insert a core rod 11.

The sectional area of the sum of the auxiliary connecting member 34 was about 0.5 mm$^2$. The group of superconducting material wires arranged around the core rod was covered with the superconducting material wires as the auxiliary connecting member 34. The thus-obtained assembly was inserted into the hollow portion of the cylindrical stabilizing member of oxygen free copper having an outer diameter of 9.0 mm a nd an inner diameter of 2.2 mm, as shown in FIG. 5(d). Thereafter, the copper sleeve was pressed toward the center of the connection portion and formed by using a die in the same way as in Example 1. The copper sleeve was further plastically worked from the upper and lower portions to produce the connecting portion shown in FIG. 5(f). The outer diameter of the connecting portion was 7.2 to 7.0 mm in finish size. In this embodiment, since the sectional area of the superconducting material wires being bonded was 0.5 mm2 and it was considered that an auxiliary connecting member is dispensed with, only the superconducting material wires were used. The packing ratio of the connecting portion obtained was about 90%, which was sufficient for practical use. The sectional areal ratio of the superconducting material wires, the core member and the stabilizing member after bonding was approximately 1:0.5:55.

EXAMPLE 3

An Nb-Ti superconducting wire having a diameter of 1.7 mm was selected for the superconducting wires 31, 32. Each of the superconducting wires 31, 32 was composed of 1060 metal superconducting material wires 3 having a diameter of 35 pm and embedded in stabilizing copper 4. Each of the superconducting wires 31, 32 was immersed in nitric acid to a depth of about 30 mm so as to remove the stabilizing copper from the portions of the metal superconducting material wires being bonded. After the portions being connected were exposed in this way, they were washed with water. Since the sum of the sectional areas of the superconducting material wires was 1.0 mm$^2$, no auxiliary connecting member was used. In order to further improve the critical current value, an oxygen free copper rod having a diameter of 1.0 mm and a length of 30 mm was inserted in the same way as in Example 2. The thus-obtained assembly was inserted into the hollow portion of the cylindrical stabilizing member of oxygen free copper having an outer diameter of 9.0 mm and an inner diameter of 2.2 mm. The cylindrical stabilizing member was then subjected to cold plastic working by using a die. The outer diameter of the connecting portion was 7.0 to 8.5 mm in finish size. The sectional areal ratio of the superconducting material wires, the core member and the stabilizing member after bonding was about 1:1:54.

COMPARATIVE EXAMPLE 1

The same superconducting wires as in Example 1 were used and the end portions of the superconducting material wires 25 mm from the respective ends were exposed by removing the stabilizing members therefrom. As shown in FIG. 5(b), the exposed superconducting material wires 33 were laminated on each other and accommodated in a connecting copper sleeve. The superconducting material wires 33 were bonded with each other by pressing them in one direction through the connecting copper sleeve. The packing ratio of the superconducting material wires at the connecting portion obtained was about 60%.

COMPARATIVE EXAMPLE 2

Superconducting wires having a diameter of 1.0 mm were selected for the Nb-Ti superconducting wires 31, 32, as in Example 1 and they were connected under the same conditions as in Example 1 except in that the core member was not used and in that the copper sleeve was pressurized only in one direction by a compressing machine. The section at the central part at the connecting portion obtained was a rectangular configuration due to unidirectional press. The packing ratio of the superconducting material wires was about 70%.

Figure 8:
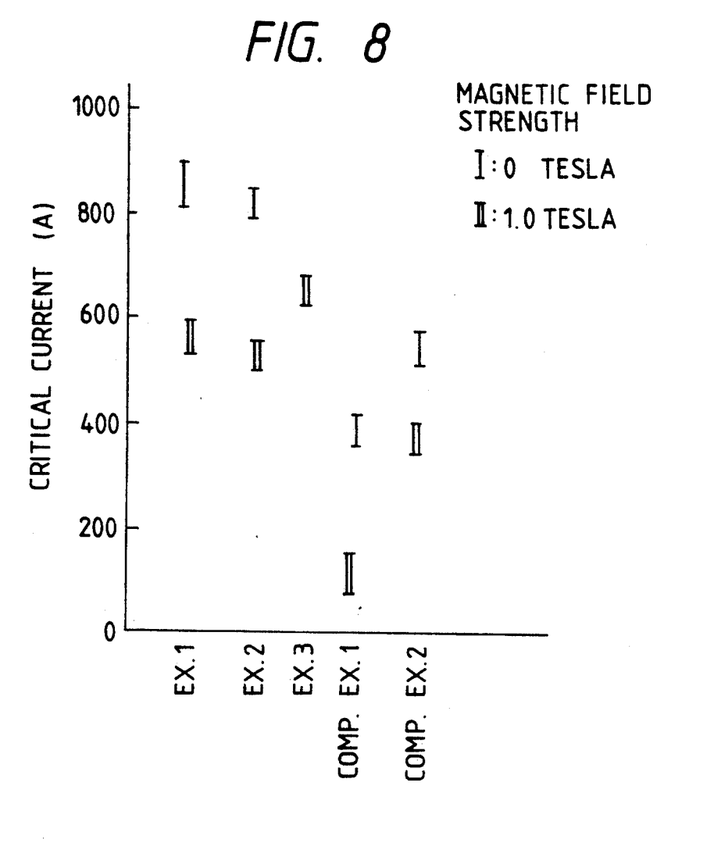
FIG. 8 is a graph of the critical current characteristics of the connecting portions in examples of the present invention and in comparative examples.

The critical current values of the bonded bodies obtained in the above Examples and Comparative Examples were measured in liquid He both without applying a magnetic field (0 T) and in a magnetic field (1.0 T). The results are shown in FIG. 8. The critical current values were measured at a voltage terminal distance of 15 mm by using a U-shaped holder. As is clear from FIG. 8, the critical current values in Examples 1 to 3 are different from each other. This is because the manufacturing methods and the superconducting wires were different. There is a slight variation in the critical current value in the same Example. This is because the outer diameter was varied in finish size for measurement. In any of Examples 1 to 3, the critical current value is higher and the variation is smaller in comparison with those in Comparative Example 1 and 2. From these results, it is clear that the superconducting wires according to the present invention are much superior.

Figure 9:
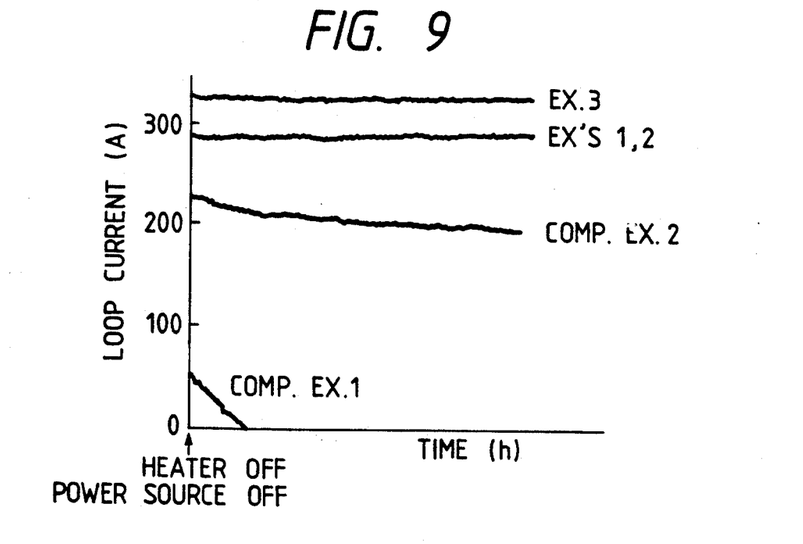
FIG. 9 is a graph of the attenuation characteristics of the loop currents at the connecting portions in examples of the present invention and in comparative examples.

A permanent circuit incorporating a permanent current switch on a coupling was produced to test the attenuation at the connecting portion. The results are shown in FIG. 9. As shown in FIG. 9, almost no attenuation was observed in any of Examples 1, 2 and 3. Examples 1, 2 and 3 exhibit a permanent current mode, in other words they attained the object of the present invention.

A loop current I(t) of a permanent current circuit after a constant time is obtained from the following equation:

$$I(t) = I_0 e^{-\frac{t}{\tau}}$$

wherein $I_0$ represent the initial current value (A), $\tau$ the attenuation time constant of the circuit and t a time. $\tau$ is obtained from the following equation:

$$\tau = \frac{L}{R}$$

wherein R is a circuit resistance and L an inductance.

The attenuation time current constant of a permanent magnet circuit was measured by an experiment. The circuit used for the experiment was a well-known circuit, which was composed of a superconducting coil, a power source for supplying a current to the superconducting coil, a permanent current switch connected in parallel to the power source and in series to the coil and a power switch for turning on/off the power source and the superconducting coil. A current was first applied from the power source to the superconducting coil which was cooled to 4K, and when a superconducting state was assumed, the permanent current switch was turned on and the power source switch was turned off. At this stage, Io was measured and the attenuation time constant of the circuit was also measured. When L=0.5 μH, and $\tau = 5 \times 10^7$, R was $10^{-14}$ Ω. When L=10H and $\tau = 10^{14}$, R was as small as $10^{-13}$ Ω. In contrast, in Comparative Example 1, the attenuation was large, which shows a bad connecting state. In Comparative Example 2, although the initial current was considerably large, the current value was slightly lowered with time. This shows that there is a slight resistance at the connecting portion. From the test of the attenuation at the coupling, it is also clear that the superconducting wires according to the present invention are superior. When the section of the connecting portion was observed, the connecting portion according to the present invention has an approximately circular section and the superconducting wires and the superconducting material wires were in close contact with each other and metal bonded in a good state through the hollow cylindrical connection stabilizing member.

In any of the various examples described above, the superconducting wires, the superconducting material-wires and the core member were metal bonded with each other through the hollow cylindrical connection stabilizing member, thereby producing a superconducting wire having a very small connection resistance.

As the hollow cylindrical connection stabilizing member, aluminum, gold, silver, etc. are also usable, and as the core rod, aluminum, Pb-Sn, In, Bi, etc. are also usable. As the apparatus for plastic working, any apparatus which can press the periphery of the hollow cylindrical connection stabilizing member isostatically or from one point toward the center such as a rolling mill and a cold isostatic press machine is applicable to the present invention.

While we have shown and described several embodiments in accordance with the present invention, it is understood that the same is not limited thereto but is susceptible to numerous changes and modifications as known to one skilled in the art, and we therefore do not wish to be limited to the details shown and described herein but intend to cover all such modifications as are encompassed by the scope of the appended claims.

We claim:

1. A superconducting magnetic field generating apparatus comprising a coil of a wound superconducting wire arrangement which is comprised of superconducting wires having end portions connected with each other, each of said superconducting wires including a plurality of superconducting material wires embedded as a group in a first stabilizing member; a superconducting switch connected to both ends of said coil; and means for cooling said coil and said superconducting switch, wherein the group of said superconducting material wires is embedded at the connecting portion in an assembled arrangement in which said superconducting material wires are densely gathered at a central portion of said first stabilizing member and said superconducting material wires are directly in contact with each other, wherein a second stabilizing member is included in the central portion of the assembly of said superconducting material wires, and wherein said first stabilizing member and said second stabilizing member are closely bonded to corresponding said superconducting material wires.

2. A superconducting magnetic field generating apparatus comprising:

a coil of a wound superconducting wire arrangement which is comprised of superconducting wires having end portions connected with each other, each of said superconducting wires including a plurality of superconducting material wires embedded as a group in a stabilizing member;

a superconducting switch connected to both ends of said coil; and means for cooling said coil and said superconducting switch, wherein the group of said superconducting material wires and another group of said superconducting material wires are embedded at the connecting portion in an assembled arrangement in which said superconducting material wires are densely gathered at a central portion of said stabilizing member and said superconducting material wires are directly in contact with each other, wherein a further stabilizing member is included in the central portion of the assembly of said superconducting material wires, and wherein said first stabilizing member and said second stabilizing member are closely bonded to corresponding said superconducting material wires.

3. A superconducting magnetic field generating apparatus comprising:

a coil of a wound superconducting wire arrangement which is comprised of superconducting wires having end portions connected with each other, each of said superconducting wires including a plurality of superconducting material wires embedded in a stabilizing member; a superconducting switch connected to both ends of said coil; and means for cooling said coil and said superconducting switch;

wherein each connection of end portions has a resistance of not more than $10^{-13}$ $\Omega$ and a critical current value of not less than 80% of the critical current value of said superconducting wire arrangement.

4. A superconducting coil including coil units each of which is a wound superconducting wire comprising a plurality of superconducting material wires embedded as a group in a stabilizing member and which are connected to each other by connecting said superconducting material wires to each other at end portions of the respective coil units so as to have a predetermined coil turn, wherein the group of said superconducting material wires is embedded at the connecting portion in an assembled arrangement in which said superconducting material wires are densely gathered at a central portion of said stabilizing member and said superconducting material wires are directly in contact with each other, wherein a low-resistance metal member is provided in the central portion of the assembly of said superconducting material wires, and wherein said stabilizing member, said metal member and said superconducting material wires are closely bonded to each other.

5. A superconducting coil including coil units each of which is a wound superconducting wire comprising a plurality of superconducting material wires embedded as a group in a stabilizing member and which are connected to each other by connecting said superconducting material wires to each other at end portions of the respective coil units so as to have a predetermined coil turn, wherein the group of said superconducting material wires and a group of connecting superconducting wires are embedded at the connecting portion in an assembled arrangement in which said superconducting material wires and said connecting superconducting wires are densely gathered at a central portion of said stabilizing member and said superconducting material wires are directly in contact with each other, wherein a low-resistance metal member exists in the central portion of the assembly of said superconducting material wires, and wherein said stabilizing member and said metal member are closely bonded to said superconducting material.

6. A superconducting coil of a wound superconducting wire arrangement which is comprised of superconducting wires having end portions connected with each other, wherein each of said superconducting wires includes a plurality of superconducting material wires embedded in a stabilizing member, and wherein each connection of end portions has a resistance of not more than $10^{-13}$ $\Omega$ and a critical current value of not less than 80% of the critical current value of said superconducting wire arrangement.

7. A superconducting wire arrangement comprised of superconducting wires each of which includes a plurality of superconducting material wires embedded as a group in a stabilizing member and which are connected to each other by connecting end portions thereof, wherein the group of said superconducting material wires is embedded at the connecting portion in an assembled arrangement in which said superconducting material wires are densely gathered at a central portion of said first stabilizing member and said superconducting material wires are directly in contact with each other, wherein a low-resistance metal member exists in the central portion of the assembly of said superconducting material wires, wherein said stabilizing member, said metal member and said superconducting material wires are closely bonded to each other, and wherein the connecting portion has a connection resistance of not more than $10^{-13}$ $\Omega$ and a critical current value of not less than 80% of the critical current value of said superconducting wire arrangement.

8. A method of producing a superconducting coil comprising the steps of:

forming predetermined turns by winding a superconducting wire of a group of superconducting material wires;

exposing the group of superconducting material wires at an end portion of said superconducting wire;

disposing a core member of a stabilizing material at a central portion of said group of superconducting material wires;

inserting said group of superconducting material wires and said core member into the hollow portion of a hollow stabilizing member; and pressing the outer periphery of the hollow stabilizing member so as to gather the exposed superconducting material wires to the direction of the core member, thereby closely bonding said hollow stabilizing member and said core member with said superconducting material wires and bridging said superconducting material wires into close contact with each other.

9. A method of producing a superconducting coil comprising the steps of:

forming a coil by winding a superconducting wire having a plurality of superconducting metal material wires embedded in a stabilizing member;

assembling an exposed portion of said superconducting metal material wires, exposed superconducting metal material wires of another superconducting wire being connected to said superconducting wire and an auxiliary connecting member to connecting end portions of said superconducting wires with a core member of a stabilizing material being inserted into a central portion thereof;

inserting said group of superconducting material wires and the end portions of said superconducting wires into the hollow portion of a hollow stabilizing member; and press working the assembled portion by applying a pressure to said hollow stabilizing member from the outside so as to gather the said superconducting material wires to the central portion of said hollow stabilizing member, thereby closely bonding said hollow stabilizing member and the core member with said superconducting material wires and bringing said superconducting material wires into direct contact with each other.

10. A method of connecting superconducting wires comprising the steps of:

gathering superconducting metal material wires exposed at the connecting end portion of a superconducting wire which has a plurality of said superconducting metal material wires embedded in a stabilizing member and the superconducting metal material wires exposed at the connecting end portion of another superconducting wire around a core member of a stabilizing material;

inserting said group of superconducting material wires and the end portions of said superconducting wires into the hollow portion of a hollow stabilizing member; and press working the assembled portion so as to gather the said superconducting material wires to a central portion of said hollow stabilizing member, thereby closely bonding said hollow stabilizing member and said core member with said superconducting material wires and bringing said superconducting material wires into direct contact with each other.

11. A method of connecting superconducting wires according to claim 10, wherein said auxiliary connecting member is one selected from the group consisting of a superconducting material wire of the same material as that of said superconducting filament, a stabilizing material and bonding material.

12. A method of connecting superconducting wires according to claim 10, wherein said auxiliary connecting member is a linear material or a powder.

13. A method of connecting superconducting wires according to claim 10, wherein said core member is one selected from the group consisting of Cu, Al, Au, Ag and an alloy thereof.

14. A superconducting magnetic field generating apparatus according to claim 1, wherein said second stabilizing member is a core member of a stabilizing material.

15. A superconducting magnetic field generating apparatus according to claim 14, wherein said core member is one selected from the group consisting of Cu, Al, Au, Ag and an alloy thereof.

16. A superconducting magnetic field generating apparatus according to claim 2, wherein said second stabilizing member is a core member of a stabilizing material.

17. A superconducting magnetic field generating apparatus according to claim 16, wherein said core member is one selected from the group consisting of Cu, Al, Au, Ag and an alloy thereof.

* * * * *